United States Patent [19]

Blaess et al.

[11] 4,290,010
[45] Sep. 15, 1981

[54] METHOD AND APPARATUS FOR MEASURING TRANSMISSION CHARACTERISTIC OF A TEST OBJECT

[75] Inventors: Gerhard Blaess, Olching; Karl Bauernfeind, Zorneding, both of Fed. Rep. of Germany

[73] Assignee: Siemens Aktiengesellschaft, Berlin and Munich, Fed. Rep. of Germany

[21] Appl. No.: 96,792

[22] Filed: Nov. 23, 1979

[30] Foreign Application Priority Data

Dec. 6, 1978 [DE] Fed. Rep. of Germany ....... 2852747

[51] Int. Cl.$^3$ ............................................. G01R 27/00
[52] U.S. Cl. .......................... 324/57 SS; 179/175.3 R; 324/57 DE
[58] Field of Search ............ 324/57 SS, 57 DE, 57 R; 179/175.3 R, 175

[56] References Cited

U.S. PATENT DOCUMENTS 3,512,083  5/1970  McCutcheon et al. ........... 324/57 R
4,064,459 12/1977  Markwitz et al. ....... 179/175.3 R X
4,129,826 12/1978  Mills ................................ 324/57 SS

OTHER PUBLICATIONS

Specification for a Group Delay Measuring Set for Audio Circuits, CCI Recommendation No. 0.81, vol. IV.2, pp. 44-50.
Cochran, Measuring Waveform Distortion With a PAR Meter, Bell Laboratories Record, vol. 43, No. 9, Oct. 1965, pp. 369-372.
French, Transfer Function Measurement Using Fast Pulses, Electronic Engineering, Aug. 1966, pp. 516-519.

Primary Examiner—Stanley T. Krawczewicz
Attorney, Agent, or Firm—Hill, Van Santen, Steadman, Chiara & Simpson

[57] ABSTRACT

Cross-talk attenuation characteristics and/or other transmission characteristics are measured by means of a method which applies a test pulse to the input of an object under test, the test pulse being composed of a plurality of component frequencies having predetermined amplitudes and initial phase angles, with the output of the test object being evaluated by means of Fourier analysis, using an FFT processor. The effective noise is substantially reduced by transmitting plural test pulses, and calculating the mean value of plural results produced sequentially by the FFT processor. Alternatively, the effective noise is reduced by reducing the widths of the effective pass bands of the evaluation by carrying on the evaluation over a period which exceeds the period of a single test pulse, or by setting the amplitudes of some components of the test pulse to zero and increasing the amplitudes of the remaining components.

19 Claims, 7 Drawing Figures

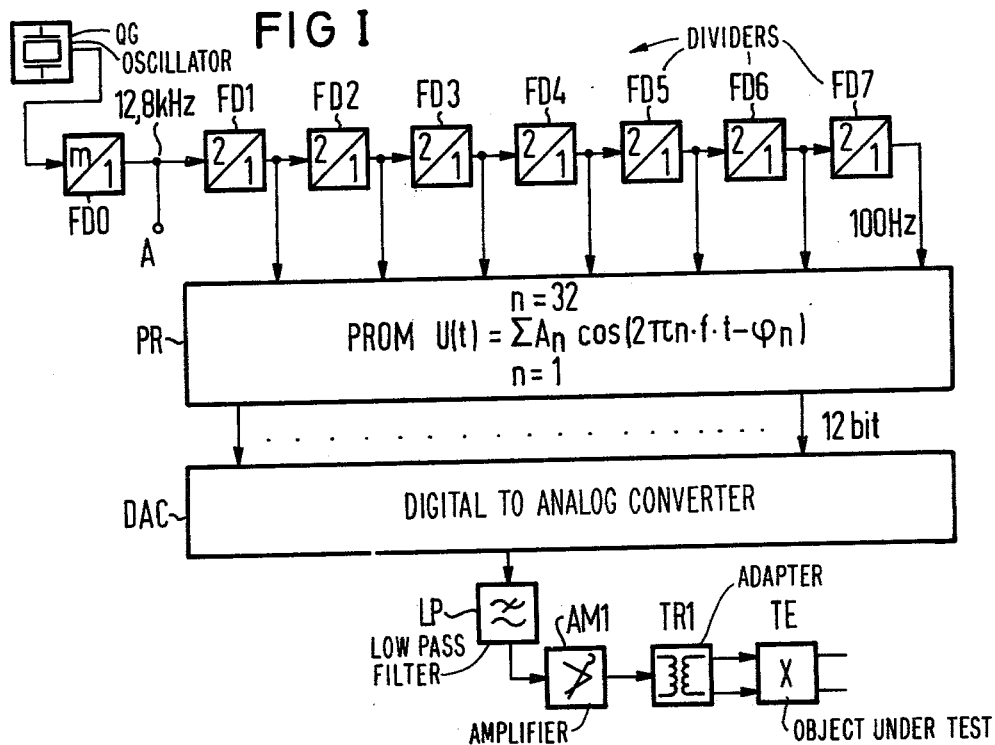
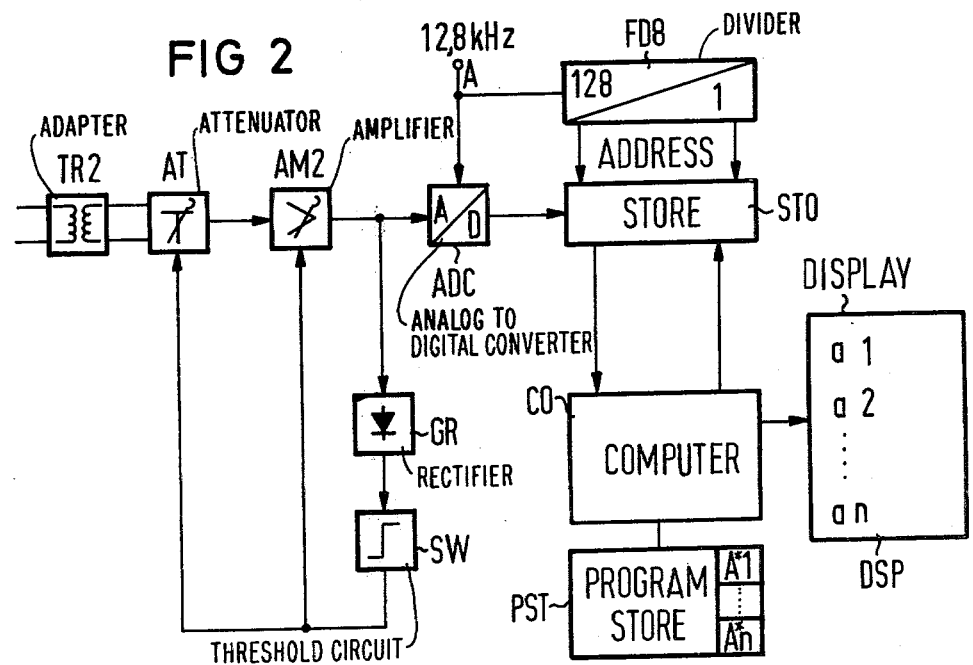

METHOD AND APPARATUS FOR MEASURING TRANSMISSION CHARACTERISTIC OF A TEST OBJECT

FIELD OF THE INVENTION

This invention relates to a method and apparatus for the measurement of attenuation and delay time distortion in a test object to which a test pulse is supplied.

THE PRIOR ART

A method for measuring the transfer function of an object under test is known from the article in "Electronic Engineering," August, 1966, pages 516–519. As described therein, a function having infinitely narrow pulses supplies a constant amplitude distribution of harmonics at all frequencies to a device under test. A sequence of such narrow pulses is delivered to the object under test, and the waveform of the signal which is produced at the output of the object under test, is recorded after sampling and subjection to Fourier analysis, using an FFT processor. The test pulse (or exciting pulse) is also sampled and subjected to Fourier analysis in the same way. In practice, an infinitely short pulse cannot be employed, but a pulse which is as short as possible is used, which produces a spectral function of sin x/x.

The prior art method has the disadvantage that both the test pulse and the distorted pulse must be recorded and subjected to Fourier analysis. When the object under test is a transmission line, the problem arises that the test pulse is not directly available at the output end of the transmission line. Thus, either an additional transmission must be undertaken of the exciting pulse, or data relating thereto, or else the data at the output end of the transmission line must be retransmitted to the input end. This requires a relatively large amount of equipment, and there is also the disadvantage that any kind of transmission failure directly influences the result of the measurement. Further, errors may enter into the measurement during the Fourier analysis, both at the input end and the output end of the transmission line.

The infinitely numerous harmonics of the exciting function sin x/x occuring with such pulses occupy very wide frequency bands and lead to disruptions of communications in adjacent channels when the measurement is undertaken in specific channels. It is also disadvantageous for practical operation that the amplitudes and phases of the individual harmonics are predetermined by the form of the exciting pulse employed and therefore cannot be freely selected. This is particularly disadvantageous when the object under test has a filter characteristic, because of limitations on the precision of the measurement of the transmission characteristics.

In evaluating the transmission characteristics of multiple electric communication lines, the evaluation of cross-talk is of particular significance. Cross-talk arises because of coupling between neighboring lines within a cable. For determining the cross-talk attenuation, it has been known, as described in Siemens Nachrichten-Messgeräte, 77/78, pages 38 and 39, to connect a standard signal generator adjustable in its frequency on the input side and to provide a receiver on the reception side. The frequency of the signal generator and the tuning of the receiver are changed together, making it possible to employ a narrow bandwidth reception channel. The narrow bandwidth is important because the cross-talk attenuation is very high and noise or communication signals of other lines can prejudice the measuring result.

BRIEF SUMMARY OF THE INVENTION

A principal object of the present invention is to provide a way in which the measurement of signals exhibiting only a small signal-to-noise ratio can be carried out with precision.

This object is achieved by the invention in that, for signals affected with disruptions, an improvement of the signal-to-noise ratio is accomplished by means of selective mean value formation, with q amplitude values gained from q test pulses transmitted in succession and allocated to a specific frequency band, and/or by means of reducing the width of specific frequency bands on the reception side.

In another embodiment of the present invention, the several components of the test pulse which is applied to the object under test are modified by setting some of the n amplitude values to zero. At the output of the object under test, those partial bands for which the amplitude values are set to zero are suppressed in the evaluation and only the amplitude values of the remaining partial frequency bands are employed for the evaluation.

In this manner, since individual amplitude values of specific components are no longer transmitted, the energy level of a test pulse can be correspondingly increased without fear of over-driving the object under test, which would produce undesired non-linearities in the output. On the reception side, the amplitude values in those partial frequency bands are suppressed in which no amplitude values were present on the transmission side, so that the corresponding disruption components of these partial frequency bands cannot enter into the measuring result.

The invention further embraces a circuit for implementing the method, the circuit having a memory on the transmission side which contains a number of sampling values from a test pulse, which sampling values are read out in succession; and a circuit at the output side of the object under test for sampling the test pulse received. The sampling values are supplied to an FFT processor, which has a memory in which amplitude values are stored. A circuit for selective mean value formation is provided whose output signal is linked to the measured values contained in the memory for the purpose of determining the magnitude to be measured.

In the present invention, the test pulse consists of a series of oscillations of different frequencies which have predetermined amplitudes in initial phases and are formed according to the equation $$V_{(t)} = \sum_{i}^{n} A_n \cdot \cos(2 \cdot \pi \cdot n \cdot f \cdot t - \phi_n)$$

where $A_n$ is the amplitude of a component n and $\phi_n$ is the initial phase of a component having a frequency $n \times f$.

BRIEF DESCRIPTION OF THE DRAWINGS

Reference will now be made to the accompanying drawings in which:

FIG. 1 is a functional block diagram of apparatus for generating a test pulse;

FIG. 2 is a functional block diagram of apparatus located at the output side of the object under test for evaluating the distorted test pulse;

DESCRIPTION OF THE PREFERRED EMBODIMENT

Figure 3:
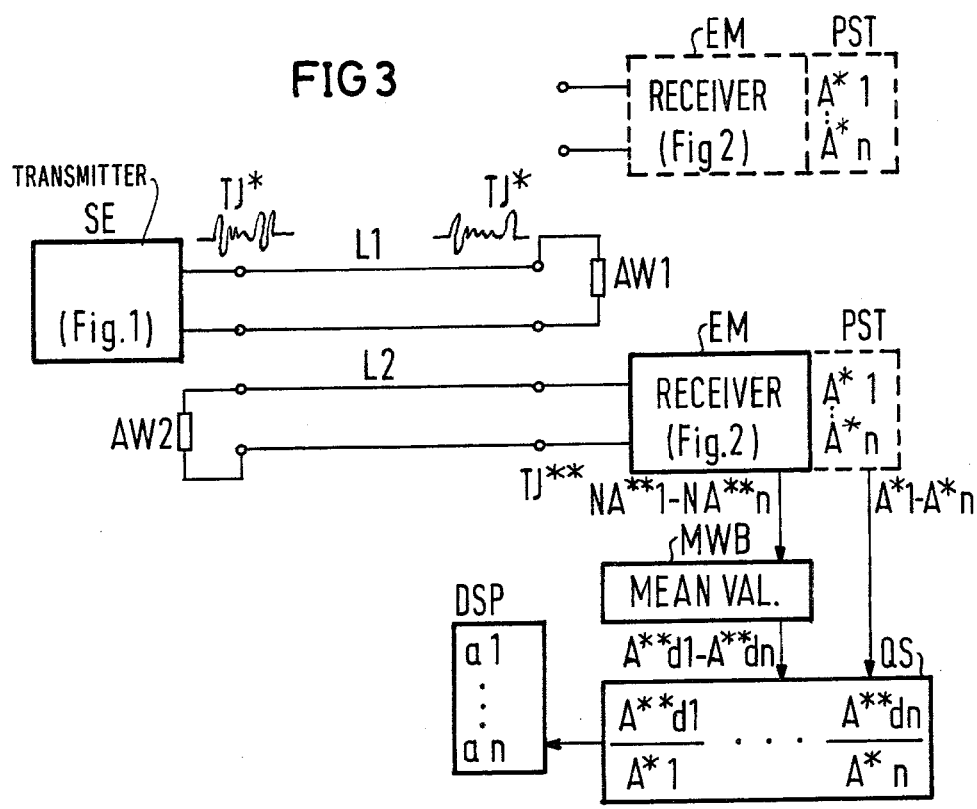
FIG. 3 is a functional block diagram of apparatus used in practicing the present invention.

Referring now to FIG. 1, apparatus is illustrated for generating a test pulse to be applied to an object under test TE. As an example, the object under test TE may be a data or telephone channel having a bandwidth of 300 Hz through 3 kHz. A crystal oscillator QG generates a signal which is connected to the input of a frequency divider FDO, which produces at its output a square wave of 12.8 kHz. This signal is applied to a series of six frequency dividers FD1 through FD6, connected in cascade, to form a binary counter. The output of each of the flip-flops FD1-FD6 are connected as address inputs to a programmable read-only memory unit (PROM) PR. A total of sixty-four different combinations of output signals are produced by the frequency dividers FD1-FD6, which successively address sixty-four storage locations within the PROM unit PR. Each memory location of the PROM unit PR contains a 12-bit word which, when accessed, is read out to the input terminals of a digital-to-analog converter DAC, which produces at its output an analog signal having an amplitude at each instant corresponding to the 12-bit digital word being accessed at that instant. Each of the 12-bit words contains the digitized instantaneous amplitude value of an undistorted time function:

$$V_{(t)} = \sum_{n=1}^{n=32} A_n \cdot \cos(2\pi \cdot n \cdot f \cdot t - \phi_n)$$

By reading out the data stored in successive storage locations of the PROM unit PR, a test pulse is generated as a step curve, the amplitude of which proceeds directly from step-to-step without any gap or return to a reference value between successive steps. My copending application Ser. No. 910,769, filed May 30, 1978 discloses an arrangement for generating a test pulse.

The test pulse has a period given by $1/f_1$ whereby $f_1$ represents the frequency of the lowest harmonic, which in the example which follows is 200 Hz.

A test pulse may be formed, for example, of sixteen individual harmonics, each having a frequency separation of 200 Hz, occupying a frequency band of between 200 Hz through 3200 Hz. A sampling frequency must be employed which is high enough so that the highest frequency (3200 Hz) is sampled more than twice. According to the sampling frequency, it must exceed 6400 Hz. In the present example, the selected sampling frequency is 12.8 kHz, so the sampling requirement for the highest frequency is met with certainty.

Since the lowest harmonic frequency is 200 Hz, the period of the test pulse is 5 ms. During each 5 ms period, the sixty-four successive sampling values are read out of the PROM unit PR, one for each cycle of the 12.8 kHz frequency, so that the interval between successive steps of the test pulse is 78.125 microseconds.

The waveform of the test pulse, with its sixteen components, is determined either by computation or graphically, with individual amplitudes $A_1$ through $A_{16}$, and with initial phase angles of $\phi_1$ through $\phi_{16}$. The amplitude of the composite test pulse is digitized and entered into the storage locations of the PROM unit PR, each digitized value corresponding to the average amplitude during an interval of 78.125 microseconds. Accordingly, when the sixty-four storage locations of the PROM unit are accessed successively, the output of the digital-to-analog converter DAC corresponds closely to the graph or computed test pulse. A low-pass filter LP is connected to the output of the digital-to-analog converter DAC to smooth the test pulse. During operation, all of the storage locations of the PROM unit PR are accessed repetitively, so that after each 5 ms period of the test pulse, a new test pulse begins at once. A sufficient number of test pulses are transmitted in succession in this manner until transients are dissipated, and the response at the output end of the object under test is constant from period to period. At least one period T has been sampled at the output end of the object under test, at the same rate as the sampling takes place at the input end, to yield sixty-four sampling values, which are stored and subjected to the Fourier analysis in either analog or digital form. The result of such analysis is to produce parameters corresponding to the individual amplitude values $A_{1*}$ through $A_{16*}$ (at the output end of the object under test) as well as the corresponding phase angles $\phi_{1*}$ through $\phi_{16*}$.

If there is any distortion such as attenuation or phase shift which occurs in the low-pass filter LP, this can be compensated by means of preliminary correction of the sampling value so as to counteract or compensate for the distortion.

The output of the low-pass filter LP is passed through an amplifier $AM_1$, which has an adjustable gain, to an adapter circuit TR1 which may be for example a line transmitter. The output of the adapter circuit TR1 is connected to the input of the object under test TE.

FIG. 2 illustrates apparatus located at the output side of the device under test TE, for evaluating the transmission characteristics of the object under test TE. The distorted test pulse first arrives at an adapter circuit TR2, the output of which is connected to the input of an attenuator AT. The output of the attenuator is passed through an amplifier AM2 and arrives at the input of an analog-to-digital converter unit ADC. The output of the amplifier AM2 is also connected through a rectifier GR to the input of a threshold circuit SW which produces a signal which adjusts the gain of the attenuator AT and the amplifier AM2. In this way, the gain of the attenuator and amplifier are adjusted so that the maximum amplitude of the distorted test pulse is equal to a fixed value. The speed of response of the circuit including the rectifier GR and the threshold circuit SW is sufficiently slow, so that the characteristics of the attenuator AT and the amplifier AM2 remain substantially constant throughout the period of the received pulse, after an initial transient period.

The analog-to-digital converter ADC is provided with a sample-to-hold circuit, which circuit is sampled by clock pulses at a frequency of 12.8 kHz, supplied to a terminal A. These signals correspond precisely to the clock signals employed in the apparatus of FIG. 1, and may be derived by connection to terminal A at the output of the divider FDO in FIG. 1.

The clock frequency is also supplied to a frequency divider FD7 which functions as a 6-bit binary counter, the outputs of which are connected to the address inputs of a storage device STO. The divider FD7 may be constructed identically to the chain of frequency dividers FD1-FD6 illustrated in FIG. 1. The storage device STO functions to store the digital outputs of the analog-to-digital converter ADC at each of sixty-four memory locations which are accessed by FD7. After sixty-four time periods have been sampled and stored, the storage device contains the digitized amplitudes corresponding to one 5 ms period of the test pulse, and the sampling and storage operation is then terminated (by means not shown).

Subsequently, the storage device STO cooperates with a computer CO by which the sixty-four sample values are subjected to a fast Fourier transform, in the manner described in the book by G. Oran Brigham, "The Fast Fourier Transform," at pages 163-171. The program for this transform is contained in the program storage device PST, which is connected with a computer CO, and which also incorporates a storage unit storing representations of the individual amplitude values $A_1$, $A_2$, ... $A_n$, and the initial phase angles $\phi_1$, $\phi_2$, ... $\phi_n$, for the original (undistorted) test pulse.

The fast Fourier transform program converts data from the time domain into the frequency domain, to yield the real ($R_n*$) and imaginary ($I_n*$) parts for each of the sixteen harmonics making up the test pulse. From these parts, the amplitude $A_n*$ for each harmonic may be calculated according to the equation:

$$A_{n*} = \sqrt{(R_{n*})^2 + (I_{n*})^2}$$

The phase $\phi_{n*}$ may also be calculated, according to the equation:

$$\phi_n = \arctg \frac{I_{n*}}{R_{n*}}$$

Programs for making these calculations are also contained in the program store unit PST.

The computer CO also carries out the selective mean value formation, which is described hereinafter. The program store unit PST contains amplitude values derived from a preceding measurement, viz., $A\cdot_1$ through $A\cdot_n$, which are the amplitude values of the cross-talk at the frequencies of the various components of the test pulse. The mean values, and the stored values, are used to calculate the cross-talk attenuation factor $a_1$ through $a_n$, which are supplied to a display or recording device DSP for display to the operator.

FIG. 3 illustrates the lay-out of the apparatus which is used in practicing the invention. A transmitter SE is connected to the input side of a transmission line L1, which is one of at least two transmission lines contained within a cable or other object under test. A transmitter S1 is constructed in accordance with the apparatus illustrated in FIG. 1, and produces test pulses TJ which have components at various frequencies. In the first step of the measuring method, a receiver EM is connected to the output end of the transmission line L1, and the individual amplitude values A*1 through A*n are calculated in the manner described in connection with FIG. 2. The receiver EM is constructed in the manner of the apparatus illustrated in FIG. 2. The amplitude values A*1 through A*n obtained in this manner are stored in the program store PST and are subsequently used for the determination of the attenuation parameters.

After the first measuring step is completed, the receiver EM is disconnected from the output end of the transmission line L1, and the line L1 is terminated in a terminating impedance AW1, as illustrated in FIG. 3. The receiver EM is then connected to the output end of a different transmission line L2, contained within the cable or other objects under test, the input side of which is terminated in a terminating impedance AW2. In the second measuring step, the signals which are induced in the transmission L2, as the result of the signal sent by the transmitter SE through the transmission line L1, result from cross-talk between the transmission lines L1 and L2. The signals which arrive at the receiver EM have a signficantly smaller amplitude as a result of the high cross-talk attenuation. The cross-talk signal at the output of the transmission line L2 is indicated in FIG. 3 by TJ. The receiver calculates the amplitude values at the various frequencies of the components of the test pulse, such values indicated in FIG. 3 by NA1 through NAn, corresponding to the component frequencies f1 through fn. The letter n indicates that the amplitudes which are calculated for each frequency component at the output of the transmission line are affected by noise N, so they do not represent a true indication of the cross-talk amplitude at that frequency. Because of the high cross-talk attenuation factor, noise represents a significant part of the signals measured at the output of the transmission line L2 and prevent a precise calculation of the cross-talk attenuation factors. The effect of the noise is lessened, however, by the use of a selective mean value formation circuit MWB, to which the signals produced by the receiver EM are applied. These signals are produced for each of q successive test pulses TJ which are transmitted one after the other without intervening gaps by the transmitter SE, so that q amplitude values are produced by the receiver EM for each component frequency. The circuit MWB forms a mean value of the q amplitude values for each frequency component, and produces output signals which are designated in FIG. 3 Ad1 through A**dn, for the component frequencies f1 through fn. The mean values have a much smaller noise component than any of the values from which the means values are formed, yielding a higher signal-to-noise ratio, and allowing the precise calculation of the cross-talk attenuation factors.

Figure 4:
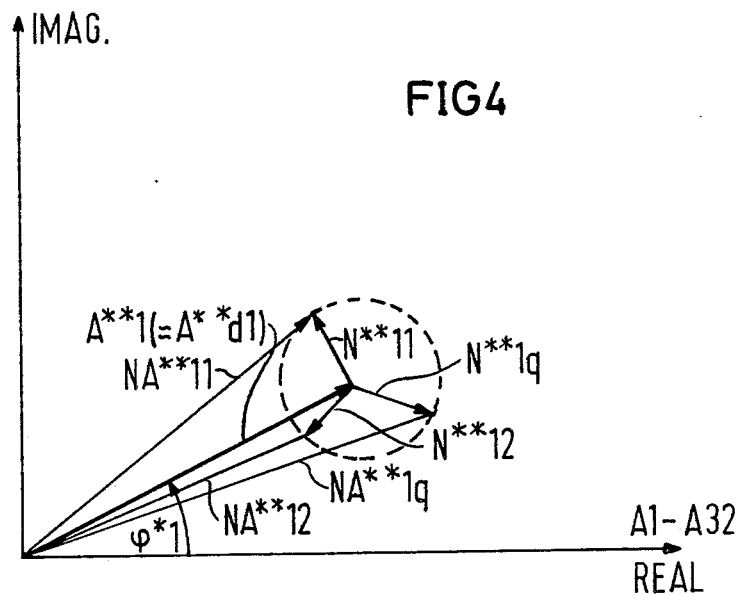
FIG. 4 is a vector diagram illustrating the effect of the selective mean value formation.

The manner in which the effect of noise is minimized is made clear from an inspection of FIG. 4. FIG. 4 is a simplified vector diagram illustrating three measurements at a single component frequency of the signals produced at the output of the object under test. The three measured values are indicated in FIG. 4 by NA11, NA12, and NA1q. The mean value calculated from these three measured values is indicated in FIG. 4 by A1, which is equal to A**d1. The phase of the mean value is indicated as $\phi*1$, in relation to the real axis, which is aligned with the test pulse component at this frequency. It can be seen that the various measured values differ from the mean value by the noise components N11, N12, and N1q. These noise components are of random phase and magnitude, so that they are averaged out by formation of the mean value A1.

Accordingly, there is a substantially reduced amount of noise present in the mean value.

The mean values $A^{}d1$ through $A^{}dn$ are supplied to a unit QS which calculates the ratio of the mean values to the corresponding signal values received over the transmission line L1 during the first step of the measurement method. These ratios or quotients are the cross-talk attenuation factors a1 through an which may be displayed by means of the display device DSP. Although in FIG. 3, the mean value formation and the ratio calculation are shown as being performed by separate units, these steps may be performed by the computer CO (FIG. 2). A cross-talk attenuation coefficient may be calculated for each of the component frequencies if desired, or alternatively for less than all of the component frequencies.

Although the above application of the present invention described above is specifically in reference to a method for increasing the precision of cross-talk measurements, it should be noted that the use of the present invention intended to minimize the effect of noise by forming the mean value of plural measurements, has application in other situations where the precision of measurements are threatened by relatively large noise signals. The method of the present invention finds use in this way in connection with distortion measurements, in the measurement of coding distortions, and in the transmission measurements with objects which have a very great attenuation.

Figure 5:
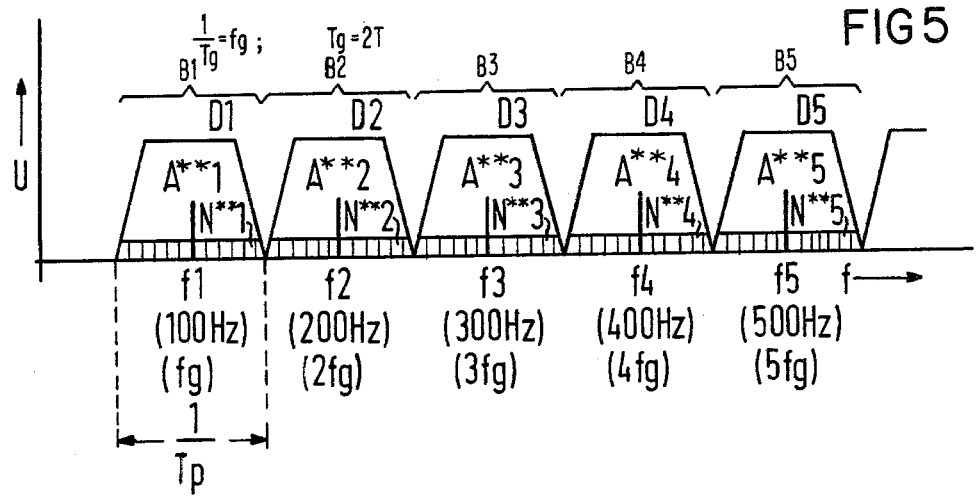
FIG. 5 is a diagram showing the filter characteristics of an FFT processor.
Figure 6:
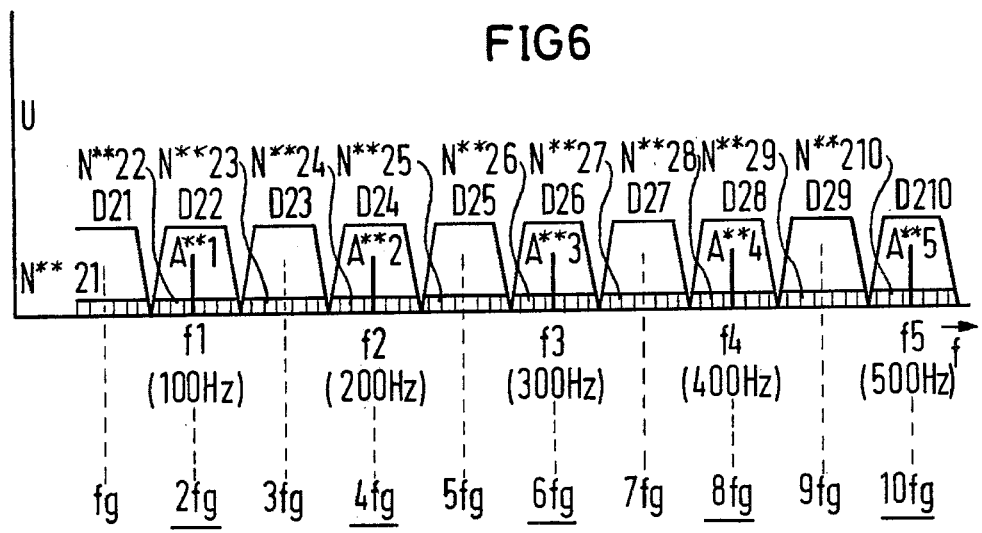
FIG. 6 is a diagram showing the effective filter characteristics of an FFT processor when the evaluation periods at the output side of the object under test are not of the same duration as the periods of the test pulses applied to the input side.

FIGS. 5 and 6 relate to alternative methods of the present invention for increasing the signal-to-noise ratio of measured values. FIG. 5 illustrates the first five components at frequencies f1 through f5 of a test pulse TJ which is applied to an object under test, with amplitudes $A^{}1$ through $A^{}5$, as the test pulse is received at the output of the object under test. The figure also shows the filter characteristic of an FFT processor, according to FIG. 2, with a pass band surrounding each component frequency. Within such pass band, a continuous distribution of noise is also illustrated, which is labeled in FIG. 5 as $N^{}1$ through $N^{}5$. Each pass band of the FFT processor has a bandwidth B approximately equal to fg where fg is designated as the basic measuring frequency. The frequency fg is equal to 1/Tg where Tg is the period with which the FFT processor functions. Where Tg is selected equal to the period T of the test pulse, fg equals f1. The pass bands of the FFT processor then are arranged so that the basic frequency fg and its whole multiples lie in the center of the pass bands B1 through Bn. Because of the practically adjacent pass bands as illustrated in FIG. 5, the noise present in the test pulse as it is received at the output of the object under test is substantially unattenuated, and interferes with the precision of the calculation. The effect of the noise can be greatly reduced, however, by choosing the processing period as a whole multiple of the period of the test pulse, so that Tg equals r·T, where T is the period of the test pulse, and r is an integral multiple. In the illustration of FIG. 6, r equals 2, so that 2 test pulses following directly after each other are evaluated together, at the output of the object under test, as if it were a single test pulse. This yields the effective filter characteristic of FIG. 6, where the basic frequency fg is one-half the fundamental frequency f1. The width of the pass bands D21 through D210 become only half as wide as illustrated in FIG. 5, and there are a series of pass bands D21, D23, D25, D27, D29, etc. in which only noise components are present, without any harmonics of the fundamental f1. The useful amplitudes of the components f1-fn remain substantially unaltered, within their pass bands, but their pass bands now contain substantially less noise than the comparable pass bands illustrated in FIG. 5. Accordingly, the signal-to-noise ratio is improved significantly. During the evaluation, all amplitude values occurring in the pass bands D21, D23, etc. which are not occupied by components of the test pulse are suppressed for the evaluation, resulting in a signficant improvement of the signal-to-noise ratio.

The increase in signal-to-noise ratio results without any change in the operation which takes place at the input side of the object under test, and so there are no disruptions which could disturb the precision of the evaluation which might result from interfering with the nature of the test pulse as applied to the input end of the object under test.

Figure 7:
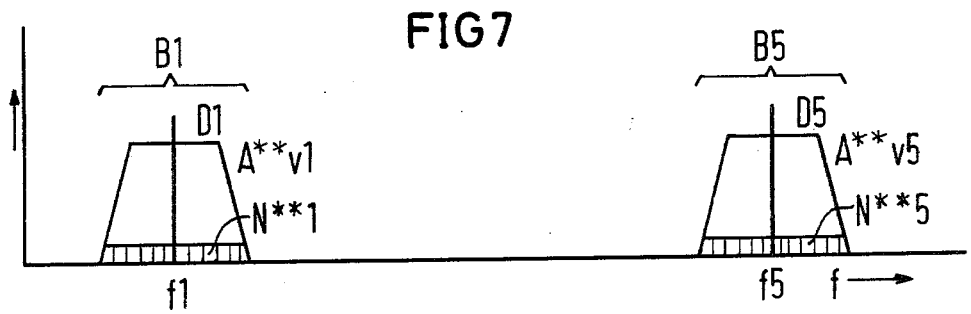
FIG. 7 is a diagram showing the effective filter characteristics of an FFT processor when some components are omitted from the test pulse.

FIG. 7 illustrates the filter characteristic which is associated with yet another method for improving the signal-to-noise ratio. When the test pulse applied to the object under test does not contain all n harmonics of the fundamental frequency, but only some of them, the filter characteristic illustrated in FIG. 7 results. FIG. 7 is for a case in which only the fundamental f1 and the component f5 are present. Accordingly, only the signals passed by the pass bands B1 and B5 need to be considered for the evaluation. Any signals at intermediate frequencies represent only noise, and may be disregarded. The amplitudes of the components f1 and f5 are made much greater, as illustrated in FIG. 7, than their counterparts in FIG. 5, so that, although the same amount of noise is permitted by the pass band of the filter characteristic, the signal-to-noise ratio is greatly increased because of the larger relative signal. Because the test pulse is composed of fewer components, both of those components may be given a larger amplitude, without any risk of over-driving the object under test. As an example, in a case where 32 cosine components are employed for the test pulse, all with an initial phase of 0°, the initial amplitude of the test pulse has the value 32 when all of the components have unit amplitudes. If, however, the test pulse has only two components f1 and f5, the amplitude of each of the components may be increased 16 times without exceeding the maximum value 32. In this way, a signal-to-noise ratio is increased by the square root of 16. This method may be effectively practiced by setting the amplitude values of some of the components (for example, components f2-f4) equal to zero, while increasing the amplitude of the remaining components of the test pulse, so that the maximum value is equal to the maximum upper limit which may be accepted by the object under test.

It is apparent from the foregoing that the methods of the present invention offer a simple and effective way of increasing the signal-to-noise ratio of a test pulse, where the received amplitude of the test pulse is weak in relation to noise, so that the presence of noise affects the precision of the measurement. It is apparent that various modifications and additions to the method of the invention, and the apparatus therefor, may be made by those skilled in the art without departing from the essential features of novelty of the invention, which are intended to be defined and secured by the appended claims.

What is claimed is:

1. A method of measuring the transmission characteristics of a test object by applying a test pulse to the input of the object and by evaluating, by Fourier analysis, the deformation of the test pulse as it is produced at the output of the object under test, said test pulse being formed of a plurality of components having different frequencies and predetermined amplitudes and initial phase angles, and formed according to the equation:

$$V_{(t)} = \sum_i^n A_n \cos(2 \cdot \pi \cdot n \cdot f \cdot t - \phi_n)$$

wherein $A_n$ is the amplitude and $\phi_n$ is the initial phase angle of the component n·f, said components being summed to form a test pulse, and including the steps of:
  transmitting a plurality of such test pulses in succession,
  receiving and evaluating each of said test pulses in succession at the output of said object under test, and
  forming the mean value of plural amplitude values derived from said evaluation for each component of said test pulse, whereby the effect of noise in the mean value is substantially reduced, in comparison with said derived values.

2. The method according to claim 1, including the step of evaluating the test pulse as it is produced at the output of said object under test once for each test pulse applied to the input of the object under test.

3. The method according to claim 1, including the step of analyzing the test pulses at the output of said object under test over a period which exceeds the period of a single test pulse applied to the input of said object under test, whereby the effective bandwidth of the pass bands of said evaluation are reduced.

4. The method according to claim 3, wherein the period over which test pulses are evaluated at the output of said object under test is selected as an integral multiple of the period of a test pulse applied to the input of said object under test.

5. The method according to claim 3, including the step of suppressing, during said evaluation, pass bands which contain no component frequencies of said test pulse at the output of said object under test.

6. The method according to claim 1, including the step of carrying on said evaluation of the test pulse as it arrives at the output of said object under test in timed relation with said test pulse whereby the components of said test pulse lie approximately in the center of the pass bands of said evaluation.

7. The method according to claim 1, including the steps of setting to zero the amplitudes of some of the n components, so that only the remaining components are employed as components of said test pulse, and, at the output end of the object under test, evaluating only the amplitude values of the components which have nonzero amplitudes.

8. The method according to claim 7, including the step of raising the amplitude of said test pulse, at the input end of said object under test, to the highest permissible value which may be applied to the input of said object under test.

9. The method according to claim 1, including the step of applying said test pulse to the input of a first transmission line within said object under test, and evaluating the output at the output of the second transmission line, whereby the cross-talk attenuation between the two transmission lines may be analyzed.

10. The method according to claim 1, including the step of applying said test pulse to the input of said object under test for an interval at least equal to the period of the lowest frequency component of said test pulse.

11. The method according to claim 1, including the step of applying successive test pulses to the input of said object under test, each test pulse after the first such test pulse beginning coincidentally with the end of the preceding test pulse.

12. The method according to claim 1, including the steps of storing in a storage device a plurality of sampling values corresponding to a succession of time intervals of a test pulse, and forming said test pulse by successively reading out said sampling values at a rate which is more than twice the highest frequency component of the test pulse.

13. A method of measuring the transmission characteristics of a test object by applying a test pulse to an input of said test object, and by evaluating, by Fourier analysis, the deformation of said test pulse as it is produced at the output of said object under test, said test pulse being formed of plural components having different frequencies and predetermined amplitudes and initial phase angles, and formed according to the equation:

$$V_{(t)} = \sum_i^n A_n \cos(2 \cdot \pi \cdot n \cdot f \cdot t - \phi_n)$$

wherein $A_n$ is the amplitude and $\phi_n$ is the initial phase angle of a component having a frequency n·f, including the step of:
  improving the signal-to-noise ratio of the measured values by reducing the relative width of the pass bands of said evaluation.

14. The method according to claim 13, including the step of reducing said bandwidth by evaluating the test pulse at the output of said object under test over a period which exceeds the period for which said test pulse is applied to the input of said object under test.

15. The method according to claim 13, wherein said bandwidth is reduced by setting the amplitudes of some of said components equal to zero, and increasing the amplitudes of the remaining components within said test pulse.

16. Apparatus for measuring the transmission characteristics of a test object comprising in combination first storage means located at the input side of an object under test for storing a plurality of sampling values corresponding to the magnitude, at consecutive time intervals formed of a plurality of frequencies, means of a test pulse for reading out said sampling values from said first storage means in succession, means for applying said test pulse to the input end of said object under test, second storage means at the output of said object under test for storing a first set of amplitude values, means at the output of said object under test for sampling sequential intervals of the test pulse as it is produced at said output and for supplying said sampled values to an FFT processor, apparatus connected to said FFT processor for forming the mean value of a plurality of results produced by said FFT processor, and means for comparing said mean values with said first set of stored values for determining a transmission characteristic of said object under test.

17. Apparatus according to claim 16, wherein said first storage device is a digital storage device and including a digital-to-analog converter and a low-pass filter connected between said digital storage device and the input of said object under test.

18. Apparatus according to claim 16, including means connected to the output of said object under test for limiting the maximum amplitude of said test pulse to a uniform level, as it is received from the output of said object under test.

19. Apparatus according to claim 16, wherein said first storage means stores time domain data relating to said test pulse, and second storage means stores frequency domain data relating to said test pulse.

* * * * *